United States Patent
Kau (10) Patent No.: US 8,605,531 B2
(45) Date of Patent: Dec. 10, 2013

(54) FAST VERIFY FOR PHASE CHANGE MEMORY WITH SWITCH

(75) Inventor: DerChang Kau, Cupertino, CA (US)

(73) Assignee: Intel Corporation, Santa Clara, CA (US)

( * ) Notice: Subject to any disclaimer, the term of this patent is extended or adjusted under 35 U.S.C. 154(b) by 328 days.

(21) Appl. No.: 13/163,916

(22) Filed: Jun. 20, 2011

(65) Prior Publication Data

US 2012/0320670 A1 Dec. 20, 2012

(51) Int. Cl.
*G11C 7/04* (2006.01)

(52) U.S. Cl.
USPC ........... 365/212; 365/211; 365/148; 365/163; 365/194

(58) Field of Classification Search
USPC ................. 365/148, 163, 212, 211, 194, 191
See application file for complete search history.

(56) References Cited

U.S. PATENT DOCUMENTS

| | | | |
|---|---|---|---|
| 7,313,020 B2 * | 12/2007 | Chae et al. | 365/185.03 |
| 7,457,158 B2 * | 11/2008 | Lee et al. | 365/185.03 |
| 7,764,477 B2 * | 7/2010 | Tang et al. | 361/56 |
| 7,969,798 B2 * | 6/2011 | Hwang et al. | 365/189.09 |
| 8,014,190 B2 * | 9/2011 | Lee et al. | 365/148 |
| 2010/0254178 A1 | 10/2010 | Tsushima et al. | |
| 2011/0019492 A1 * | 1/2011 | Kawaguchi et al. | 365/201 |
| 2011/0103139 A1 | 5/2011 | Kau et al. | |

FOREIGN PATENT DOCUMENTS

| | | |
|---|---|---|
| JP | 2011-028799 A | 2/2011 |
| KR | 10-2009-0123244 A | 12/2009 |
| KR | 10-2009-0126587 A | 12/2009 |
| WO | 2012/177534 A2 | 12/2012 |

OTHER PUBLICATIONS

International Search Report and Written Opinion received for PCT Patent Application No. PCT/US2012/042877, mailed on Mar. 21, 2013, 9 pages.

* cited by examiner

*Primary Examiner* — Andrew Q Tran
(74) *Attorney, Agent, or Firm* — Cool Patent, P.C.

(57) ABSTRACT

A phase change memory with switch (PCMS) compensates for threshold voltage drift by utilizing a lower demarcation voltage for a verify operation after programming than for a read operation occurring at least a predetermined period of time after the programming operation.

20 Claims, 6 Drawing Sheets

FAST VERIFY FOR PHASE CHANGE MEMORY WITH SWITCH

TECHNICAL FIELD

The present subject matter relates generally a field of electronics including semiconductor memory devices. More specifically, the present subject matter relates to phase change memory devices.

BACKGROUND

Memory for computers or other electronic devices can include blocks of memory cells integrated into a larger integrated circuit or stand-alone integrated circuits. There are many different types of memory including random-access memory (RAM), read only memory (ROM), dynamic random access memory (DRAM), static RAM (SRAM), synchronous dynamic RAM (SDRAM), flash memory and phase change memory. Phase change memory devices utilize materials that have different electrical properties in their crystalline and amorphous phases. A phase change memory cell may be programmed by putting the material in the memory cell into either a crystalline phase or an amorphous phase providing non-volatile memory that does not require power to retain its contents. Phase change memories are often programmed using heat generated by an electrical current to control the state of the phase change material.

Phase change memory cells may be made from chalcogenide materials. Chalcogenide materials include at least one element from Group VI A of the periodic table. Chalcogenide phase change material, if heated to a temperature above its melting point and allowed to cool quickly, will remain in an amorphous glass-like state with a high electrical resistance. The chalcogenide phase change material, if heated to a temperature above its glass transition temperature $T_g$ but below the melting point, will transform into a crystalline phase having a much lower resistance with a much lower voltage threshold to start the flow of current. This difference in the material properties between the amorphous and crystalline phases of chalcogenide materials may be used to create a phase change memory device.

BRIEF DESCRIPTION OF THE DRAWINGS

The accompanying drawings, which are incorporated in and constitute part of the specification, illustrate various embodiments of the claimed subject matter. Together with the general description, the drawings serve to explain the principles of the claimed subject matter. They should not, however, be taken to limit the claimed subject matter to the specific embodiments described, but are for explanation and understanding of the claimed subject matter. Such subject matter may be understood by reference to the following detailed description if read with the accompanying drawings in which:

DETAILED DESCRIPTION

In the following detailed description, numerous specific details are set forth by way of examples in order to provide a thorough understanding of the relevant teachings. However, it should be apparent to those skilled in the art that the present teachings may be practiced without such details. In other instances, well known methods, procedures and components have been described at a relatively high-level, without detail, in order to avoid unnecessarily obscuring aspects of the present concepts. A number of descriptive terms and phrases are used in describing the various embodiments of the claimed subject matter. These descriptive terms and phrases are used to convey a generally agreed upon meaning to those skilled in the art unless a different definition is given in this specification.

Figure 1:
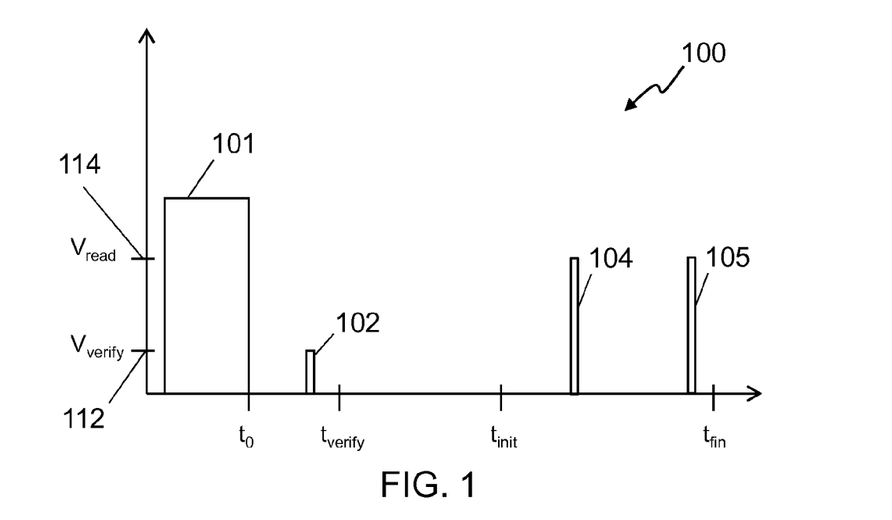
FIG. 1 is a timing diagram showing a programming period followed by a fast verify and two read operations according to an embodiment.

FIG. 1 is a conceptual timing diagram 100 showing a programming period 101 followed by a fast verify 102 and two read operations 104, 105 according to an embodiment of a fast verify for phase change memories with switch. The vertical axis represents increasing voltage and the horizontal axis represents passage of time. Neither axis of this graph should be interpreted as being linear, logarithmic, or consistent with any scale other than higher on the vertical axis representing a higher voltage and farther right on the horizontal axis representing later in time. While the following description refers to phase change memory with switch devices, other types of devices that exhibit a drift in threshold voltage may be used in other embodiments.

Programming period 101 is used to program the storage element and ends at time $t_0$ and may have an electrical waveform in various embodiments that exhibit different voltage and/or current characteristics than the waveform shown for programming period 101, depending on the embodiment. Programming the storage element may return the threshold voltages, $V_{TH\_Set}$ and $V_{TH\_Reset}$, of the device to nominal values. Various characteristics for the programming period 101 are discussed in following sections. In some embodiments, the programming period 101 may include a cooling time before $t_0$ where no voltage or current is applied to the storage element.

The storage element may exhibit a drift in $V_{TH\_Set}$ and $V_{TH\_Reset}$, referred to collectively as $V_{TH}$, from their nominal values. The phenomenon of drift of $V_{TH}$ is described in more detail below. Due to the drift of $V_{TH}$, a different demarcation voltage ($V_{DM}$) may be used to determine the state of the storage element at different times. For most embodiments that may utilize a glassy phase change material in the storage element and/or switch, such drift may cause $V_{TH}$ to increase over time due to glass relaxation physics, although other materials may drift with different characteristics.

The fast verify 102 may occur at a time after $t_0$ but before $t_{verify}$ time has elapsed since $t_0$ and may be initiated by some embodiments without any external involvement from a processor or other circuitry, although other embodiments may involve various other circuits, software or other approaches or apparatus to initiate a verify operation. The value of $t_{verify}$ may vary widely in different embodiments depending on the materials used, the geometry of the device and other factors. In many embodiments, the value of $t_{verify}$ may be less than about 1 microsecond (ps). In some embodiments, the value of $t_{verify}$ may be about 100 nanoseconds (ns) or even less, such as typically about 10-50 ns or even under 10 ns for some embodiments. The fast verify 102 may apply a demarcation voltage, $V_{DM}$, equal to $V_{verify}$ 112, across the storage element that is between the threshold voltages of the storage element in the set state $V_{TH\_sec}$ and the reset state $V_{TH\_Reset}$ during the time period from $t_0$ to $t_{verify}$. By applying $V_{DM}$ across the storage element, the storage element may conduct more current in one state than in the other state, allowing the state of the storage element to be verified as having been correctly programmed in the programming period 101. In some embodiments, if the fast verify 102 shows that the storage element has not been properly programmed in the programming period 101, the storage element may be re-programmed and re-verified, creating a new starting point for the various following times of the diagram 100 by creating a new $t_0$.

A primary usage period for accessing the storage element may begin at $t_{init}$ and end a $t_{fin}$. The time values of $t_{init}$ and $t_{fin}$ may vary widely, depending on the embodiment. In many embodiments, $t_{fin}$ may be at least 1 year although some embodiments may use a $t_{fin}$ that is longer or shorter than one year. In many embodiments, $t_{init}$ may be at least 1 microsecond (μs). In some embodiments, $t_{init}$ may be between 1 ms and 10 ms, such as about 3 ms in at least one embodiment.

A demarcation voltage, $W_{DM}$, equal to $V_{read}$ 114 may be chosen that is valid during the primary usage period so that any read request that occurs between $t_{init}$ and $t_{fin}$ may be handled by applying $V_{read}$ 114 across the storage element, such as read operation 104 and read operation 105, and detecting current flowing through the storage element to determine the state of the storage element. In some embodiments, the useful life of a device may be limited to $t_{fin}$ as a voltage higher than the operating voltage of the device might be involved to read or program a storage element that has been allowed to age past $t_{fin}$ since it was last programmed. In other embodiments, other approaches or mechanisms may be employed to ensure that no storage element is allowed to age to $t_{fin}$ without being programmed. Such approaches or mechanisms may include refresh circuitry or software programs performing operations similar to the refresh circuitry of a dynamic random access memory (RAM) device, albeit on a much longer time scale.

Read operation 104 may occur at any time between $t_{init}$ and $t_{fin}$. The read operations 104, 105 may apply a demarcation voltage, $V_{DM}$, equal to $V_{read}$ 114, across the storage element that is between the threshold voltages of the storage element in the set state $V_{TH\_Set}$ and the reset state $V_{TH\_Reset}$ during the time period from $t_{init}$ to $t_{fin}$. Because time may have elapsed between $t_{verify}$ and $t_{init}/t_{fin}$, $V_{TH}$ may be higher at $t_{init}$ and $t_{fin}$ than at $t_{verify}$, so $V_{read}$ 114 may be a higher voltage than $V_{verify}$ 112. If the storage element is in a low resistance state, applying $V_{read}$ 114 may return $V_{TH\_Set}$ to a nominal value, but if $V_{read}$ 114 is applied to a storage element in a high resistance state, little if any current may flow through the storage element, so $V_{TH\_Reset}$ may not be returned to a nominal value.

In some embodiments, if a read request is received in the time period between $t_0$ and $t_{init}$, the read operation may be delayed until after $t_{init}$ and $V_{read}$ 114 may be used to determine the state of the storage element. In other embodiments, a read request received in the time period between $t_{verify}$ and $t_{init}$ may be handled using a different demarcation voltage that may be between $V_{verify}$ 112 and $V_{read}$ 114.

If only a single $V_{DM}$ were to be used for verify and read operations, a PCMS cell 200 could not be verified until $t_{init}$, due to the requirement that the PCMS cell be read up to time $t_{fin}$. This delay could significantly impact the performance of the PCMS memory device. The fast verify described herein may significantly increase the performance of a PCMS memory device as compared to a memory device using a single value for $V_{DM}$ for verify and read operations.

Figure 2:
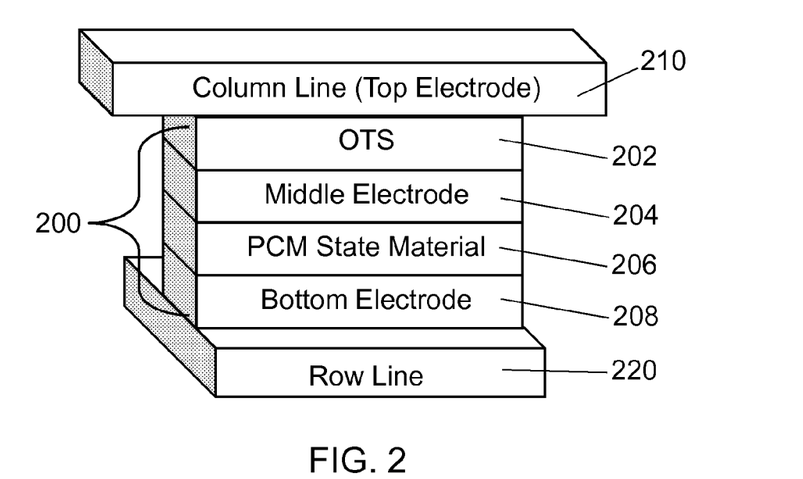
FIG. 2 is a diagram showing a phase change memory with switch (PCMS) cell suitable for use in various embodiments of a fast verify.

FIG. 2 is a diagram showing a phase change memory with switch (PCMS) cell 200 suitable for use in various embodiments of a fast verify as the storage element. In the embodiment shown, the PCMS cell 200 is coupled to a column line 210 and a row line 220 on opposing sides of PCMS cell 200 to selectively enable writing data to and/or reading data from PCMS cell 200. Column line 210 and/or row line 220 may be referred to as an address line, where a given pair of lines may be used to address the PCMS cell 200 during programming or reading. Column line 210 and/or row line 220 may also be referred to as a bit line and/or a word line, depending on whether or how column line 210 and/or row line 220 is used in accessing a specific one PCMS cell or multiple different PCMS cells.

PCMS cell 200 may include an ovonic threshold switch (OTS) 202 to selectively isolate the PCMS cell 200 from conducting current, a middle electrode 204, a phase change state material 206 to maintain a state representing a particular stored data value and a bottom electrode 208. The aforementioned elements may be formed by successive layers between column line 210 and row line 220 or in other geometric relationships, depending on the embodiment. It is understood that PCMS cell 200 may not include all of the elements described and may include any of a variety of additional and/or alternative structures according to various embodiments as long as the structures individually or in combination provide PCMS cell 200 with one or more $V_{TH}$ drift characteristics as described herein.

The phase change material 206 may be a material having electrical properties such as resistance, capacitance, or other electrical characteristics, that may be changed through the application of energy such as, for example, heat, light, voltage potential, or electrical current. A large variety of phase change material types with widely differing properties may be selected for the phase change state material 206. The phase change state material 206 may include a stoichiometric or a non-stoichiometric compound. The phase change state material 206 may include a eutectic or a peritectic material. The phase change state material 206 may include single-phase or multiphase materials. The phase change state material 206 may be doped with various elements. In various embodiments, the phase change state material 206 may have a binary composition, a ternary composition, or a quaternary composition or be composed of even more elements. In another embodiment, phase change state material 206 may have a pseudo-binary composition. In some embodiments, the phase change memory cells may be made from chalcogenide materials.

Phase change state material 206 may remain stable locally in one of two phases or in a combination of the two phases over an operating temperature range and exhibit different electrical properties in the amorphous phase than in the crystalline phase. In various embodiments, the phase change state material 206 may include two properties: (a) it can exist locally in an amorphous phase without crystallization for a prolonged period of time, such as for several years, at room temperature, and (b) the amorphous phase can crystallize rapidly if temperature is raised. The exact characteristics of the phase change state material 206 depend on the type of material and the phases of the material that are used, but in some embodiments, the phase change state material 206 may be put into a high resistance state or a low resistance state. The high resistance state may be referred to as the reset state and the low resistance state may be referred to as the set state, although in some embodiments the terminology may be reversed. In some embodiments, the high resistance state may be created by putting the phase change state material 206 into a predominately amorphous phase and the low resistance state may be created by putting at least a portion of the phase change state material 206 into a crystalline phase. Other embodiments may create more than two logical states by using various combinations of the phases to create different resistance ranges.

It should also be noted that in some embodiments, the two states may not be characterized by a pure resistance but may be characterized by a change in a threshold voltage where a significant amount of current begins to flow. The state with a low threshold voltage may be referred to as the low resistance state and the state with a higher threshold voltage may be referred to as the high resistance state, even though either state may have a low resistance if the threshold voltage is exceeded. So in the following description, referring to changing the resistance may actually mean that the threshold voltage changes and references to a low or high resistance state may actually mean a low or high voltage threshold, depending on the embodiment.

Examples of a phase change state material 206 may include a chalcogenide material or an ovonic material. An ovonic material may be a material that undergoes electronic or structural changes and acts as a semiconductor if subjected to application of a voltage potential, an electrical current, light, heat, etc. An ovonic material may be used in a memory element or in an electronic switch.

A chalcogenide material may be a material that includes at least one element from Group VI A of the periodic table. Group VI A of the periodic table includes elements such as sulfur (S), selenium (Se), and tellurium (Te). Phase change materials often also include elements from other groups of the periodic table, such as Group III A (gallium (Ga) and indium (In)), Group IV A (silicon (Si), germanium (Ge), and tin (Sn)), Group V A (phosphorus (P), arsenic (As), antimony (Sb), and bismuth (Bi)), Group I B (silver (Ag) and gold (Au)), and/or Group VIII B (cobalt (Co) and palladium (Pd)). Phase change state material 206 may be a chalcogenide element composition of the class of tellurium-germanium-antimony ($Te_xGe_ySb_z$) material or a GeSbTe alloy, although various embodiments are not limited to just these.

The phase change state material 206 may be programmed into one of at least two memory states by applying an electrical signal to phase change state material 206 to alter the phase of at least some of the phase change state material 206 between a crystalline phase and an amorphous phase. Programming of phase change state material 206 to alter phase of the material may be accomplished by applying voltage potentials to middle electrode 204 and bottom electrode 208, thereby generating a voltage potential across phase change state material 206. An electrical current may flow through a portion of phase change state material 206 in response to the applied voltage potentials, and may result in heating of phase change state material 206 which may alter the phase of at least some of the phase change state material 206 and thereby altering the resistance of the phase change state material 206. The phase change state material 206 may also be referred to as a programmable resistive material or simply a programmable material.

In one embodiment, a voltage potential difference of about three volts (3V) may be applied across a portion of phase change state material 206 by applying about 3V to electrode 204 and about 0V to electrode 208. A current may flow through phase change state material 206 in response to the applied voltage potentials, and may result in heating of phase change state material 120. This heating and subsequent cooling may alter the memory state or phase of phase change state material 120. Various resistances of phase change state material 206 may be achieved to store information by varying the amount of current flow and duration through the volume of phase change state material 120.

In general, a crystallization time of the phase change state material 206 decreases with increasing temperature. For example, if an amorphous phase change state material 206 of one embodiment is heated up to ~150 degrees Celsius (C), it may crystallize within a minute or so. If the embodiment of the amorphous phase change state material 206 is heated quickly up to ~200 C, it may crystallize within a second. If the embodiment of the amorphous phase change state material 206 is heated very quickly up to ~300 C, such as by a pulse, it may crystallize within a microsecond or even faster. For the phase change state material 206, the crystalline phase is energetically more favorable (lower free energy) than the amorphous phase. But if a crystalline volume of the embodiment of the phase change state material 206 is then heated above the melting temperature of the phase change state material 206, such as to a temperature >~650 C, and allowed to then cool quickly, the phase change state material 206 may revert to an amorphous phase.

In a set state, a portion of the phase change state material 206 may be in a crystalline or semi-crystalline state or at least a small filament of the phase change state material 206 may be conductive. In a reset state, at least a portion of phase change state material 206 may be in an amorphous or semi-amorphous state. The resistance of phase change state material 206 in the amorphous or semi-amorphous state may be greater than the resistance of phase change state material 206 in the crystalline or semi-crystalline state. It is to be appreciated that the association of reset and set with amorphous and crystalline states, respectively, is a convention and that at least an opposite convention may be adopted.

The information stored in PCMS cell 200 may be read by checking the $V_{TH}$ of the PCMS cell 200, which may indirectly measure the resistance of phase change state material 206. As an example, to read the state of the PCMS cell 200, a demarcation voltage, $V_{DM}$, may be provided to PCMS cell 200 using column line 210 and row line 220, and a resulting current flowing through the PCMS cell 200 may be compared against a threshold current using, for example, a sense amplifier (not shown). If $V_{DM}$ is greater than the $V_{TH}$ of the PCMS cell 200, a significant amount of current that is greater than the threshold current may flow through the PCMS cell 200, indicating that the phase change state material 206 is in the set state. If $V_{DM}$ is less than the $V_{TH}$ of the PCMS cell 200, the current flowing through the PCMS cell 200 may be much less than the threshold current, indicating that the phase change state material 206 is in the reset state. In an alternative embodiment, the $V_{DM}$ may be applied through a source resistance and the resulting voltage across the phase change state material may be sensed instead of the current.

OTS 202 may be used to access phase change state material 206 during programming or reading of phase change state material 206. OTS 202 may include ovonic material to operate as a switch that is either off or on depending on an amount of voltage potential applied across the ovonic material. The off state may be a substantially electrically nonconductive state and the on state may be a substantially conductive state. For example, OTS 202 may have a $V_{TH}$ and if a voltage potential less than the $V_{TH}$ of OTS 202 is applied across OTS 202, then OTS 202 may remain off or in a relatively high resistive state so that little or no electrical current passes through the PCMS cell 200. Alternatively, if a voltage potential greater than the threshold voltage of OTS 202 is applied across OTS 202, then OTS 202 may turn on and operate in a relatively low resistive state so that electrical current passes through the PCMS cell 200. In other words, OTS 202 may be in a substantially electrically nonconductive state if less than $V_{TH}$ is applied across OTS 202 and OTS 202 may be in a substantially conductive state if greater than $V_{TH}$ is applied across OTS 202. OTS 202 may also be referred to as an access device or an isolation device. Other embodiments may use other devices as the access or isolation device such as a traditional diode or field effect transistor (FET).

In some embodiments, OTS 202 may utilize a chalcogenide or an ovonic material, and may be referred to as an ovonic threshold switch, or simply an ovonic switch. The switching material of OTS 202 may be a material in a substantially amorphous state positioned between two electrodes that may be repeatedly and reversibly switched between a higher resistance off state that may be greater than about 10 mega-ohms (MΩ) and a relatively lower resistance on state that may be less than about 1000 ohms (Ω), by application of a predetermined electrical current or voltage potential. In the embodiment shown, OTS 202 may be a two terminal device that may have a current-voltage (I-V) characteristic similar to a phase change memory element that is in the amorphous state. However, unlike a phase change memory element, the switching material of OTS 202 may not change phase. That is, the switching material of OTS 202 may not be a programmable material, and as a result, OTS 202 may not be a memory device capable of storing information. For example, the switching material of OTS 202 may remain permanently amorphous and the I-V characteristic may remain the same throughout the operating life.

Figure 3:
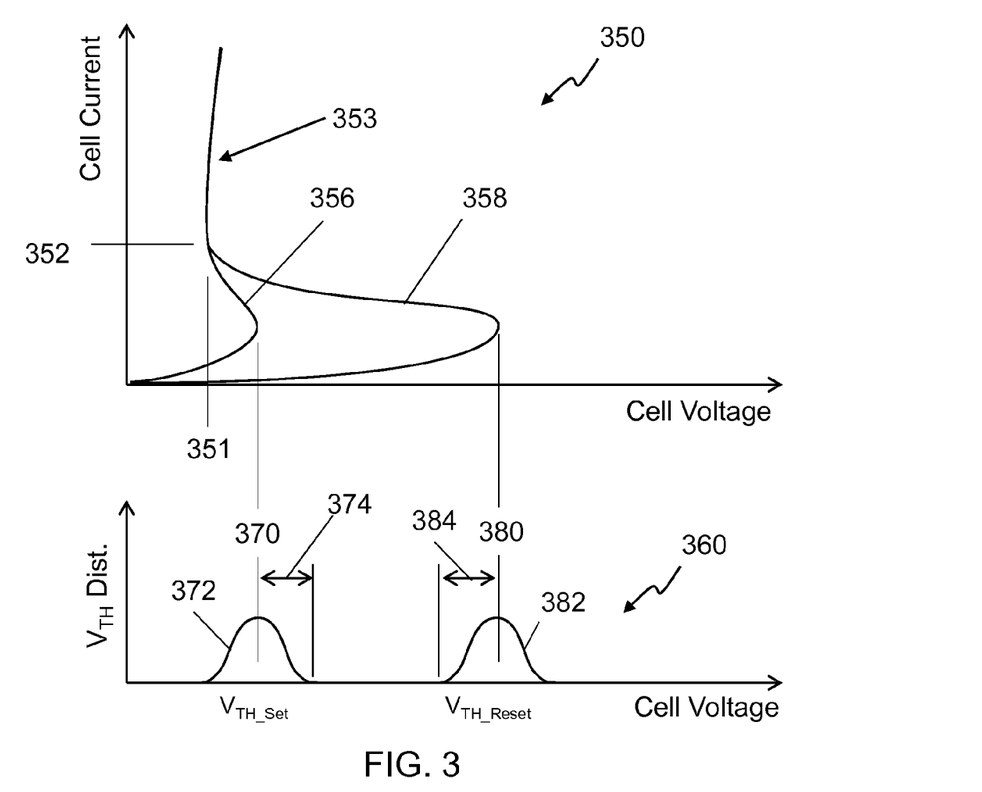
FIG. 3 is a pair of graphs showing a representation of PCMS cell current as a function of PCMS cell voltage and threshold voltage distributions of a PCMS cell.

FIG. 3 shows a representation of PCMS cell current as a function of PCMS cell voltage in graph 350 and threshold voltage distributions of a PCMS cell 200 in graph 360. More particularly, graph 350 includes a curve 356 for the cell current which is carried by PCMS cell 200 if the phase change state material 206 of the PCMS cell 200 is in a crystalline/semi-crystalline phase, or set state, for a range of voltages applied across the PCMS cell 200. Graph 350 also includes a curve 358 for the cell current which is carried by PCMS cell 200 if the phase change state material 206 is in an amorphous/semi-amorphous phase, or reset state, for a range of voltages applied across the PCMS cell 200.

As shown in graph 350, a set threshold voltage $V_{TH\_Set}$ 370 corresponds to an inflection point in curve 356, where the PCMS cell 200 in a set state begins to exhibit very large changes in cell current, greater than a threshold current, $I_{TH}$, 352, for small changes in cell voltage. For example, in a low voltage or low electric field mode where the voltage applied across PCMS cell 200 is less than a $V_{TH\_Set}$ 370, PCMS cell 200 may be off or effectively nonconductive, and exhibit a relatively high resistance that may be larger than about 10 MΩ in some embodiments. In other embodiments, the resistance of the PCMS cell 200 in the high resistance state may be much lower than 10 MΩ, such as about 100 kΩ. The absolute resistance of the PCMS cell 200 is not important as long as the relative difference of the resistance of the PCMS cell 200 in the set and reset states can be reliably distinguished. PCMS cell 200 may remain essentially nonconductive until a voltage at least equal to about $V_{TH\_Set}$ 370 is applied that may switch PCMS cell 200 to a conductive, relatively low resistance on state. If a voltage potential of greater than about $V_{TH\_Set}$ 370 is applied across PCMS cell 200, the current carried by PCMS cell 200 changes greatly for small changes in the applied voltage as can be seen in the highly conductive region 353 of the curve 356.

Similarly, a reset threshold voltage $V_{TH\_Reset}$ 380 corresponds to an inflection point in curve 358 where the PCMS cell 200 in a reset state begins to exhibit very large changes in cell current, greater than $I_{TH}$ 352, for small changes in cell voltage. For example, if a voltage potential of at least about $V_{TH\_Reset}$ 380 is applied across PCMS cell 200, the current carried by PCMS cell 200 changes greatly for small changes in applied voltage as can be seen in the highly conductive region 353 of the curve 358. The values of $V_{TH\_Set}$ 370 and $V_{TH\_Reset}$ 380 a very short period of time, such as 100 picoseconds (ps), after a device is programmed may be referred to as the nominal $V_{TH}$ values.

In one or more embodiments, the targeted voltage applied across the PCMS cell 200 to determine a current state of the PCMS cell 200, which may be between VTH_Set 370 and VTH_Reset 380, may be referred to as a demarcation voltage (VDM). Because of the non-linear characteristics of the PCMS cell 200 as shown in the graphs 356, 358, the application of VDM might result in very high currents if the VDM were to be maintained across the PCMS cell 200 in the set state. As VDM is applied to across the PCMS cell 200 through a resistance, a voltage waveform may be created across the PCMS cell 200 that may be dependent on the current state of the PCMS cell 200. The resistance may be a separate element in series with the source of VDM, or it may be inherent in the driver or switch used to connect the source of VDM to the PCMS cell 200. The voltage waveform that is created by attempting to apply VDM across a PCMS cell 200 in the set state may never reach VDM, although it may not exceed VDM, and might rise for a short period of time to the threshold voltage, VTH_Set 370, before falling back to a conduction voltage 351 that may vary only slightly with large changes in current as shown by the highly conductive region 353 of the curve 356. The voltage waveform that is created by attempting to apply VDM across a PCMS cell 200 in the reset state may rise to VDM and stay at or near that voltage. The length of the voltage waveform, with the PCMS cell 200 in either the set or reset state, depends on the specifics of the technology used in the embodiment, but may be long enough to allow the state of the PCMS cell 200 to be determined.

Graph 360 shows a conceptual representation of voltage threshold distribution for multiple PCMS cells. More particularly, graph 360 illustrates how the respective set threshold voltages and reset threshold voltages of multiple PCMS cells are distributed along the cell voltage range where the vertical axis can be thought of as a percentage of PCMS cells exhibiting $V_{TH}$ at a particular voltage level in a particular state. The distributions may represent a large number of PCMS cells on a single integrated circuit die or distributed over a multitude of integrated circuit dice and may also represent variation over various operating voltages, operating temperatures, process variations or other parameters that may affect $V_{TM}$. In a production environment, the integrated circuit dice, or a sample of dice representing a larger group of integrated circuit dice, may be tested to ensure that $V_{TM}$ for that die or group of dice fall within the design parameters represented by the targeted distributions.

A first distribution $D_{Set}$ 372 of graph 360 represents an illustrative group of $V_{TH}$ for multiple PCMS cells if the phase change state material are in a set state. $D_{Set}$ 372 may be characterized by one or more parameters including, but not limited to, any of a variety of combinations of one or more statistical measures such as, but not limited to, distribution mean, median, standard deviation, etc. In at least one embodiment, $V_{TH\_Set}$ 370 may be the mean of $D_{Set}$ 372. Similarly, a second distribution $D_{Reset}$ 382 of graph 360 represents an illustrative group of $V_{TH}$ for multiple PCMS cells if the cells are in a reset state. $D_{Reset}$ 382 may also be characterized by one or more parameters as described above and in at least one embodiment, $V_{TH\_Reset}$ 380 may be the mean of $D_{Reset}$ 382.

By way of illustration and not limitation, $D_{Set}$ 372 is shown as centered on $V_{TH\_Set}$ 370 and having a spread 374. The $V_{TH}$ for cells in the set state of a particular device may fall within a range of $V_{TH\_Set}$ 370±spread 374. $D_{Reset}$ 382 is shown as centered on $V_{TH\_Reset}$ 380 with a spread 384. The $V_{TH}$ for cells in the reset state of a particular device may fall within a range of $V_{TH\_Reset}$ 380±spread 384. It is understood that the location and/or shape of either or both of $D_{set}$ 372 and $D_{Reset}$ 382 along the cell voltage range may vary, according to different embodiments.

Figure 4:
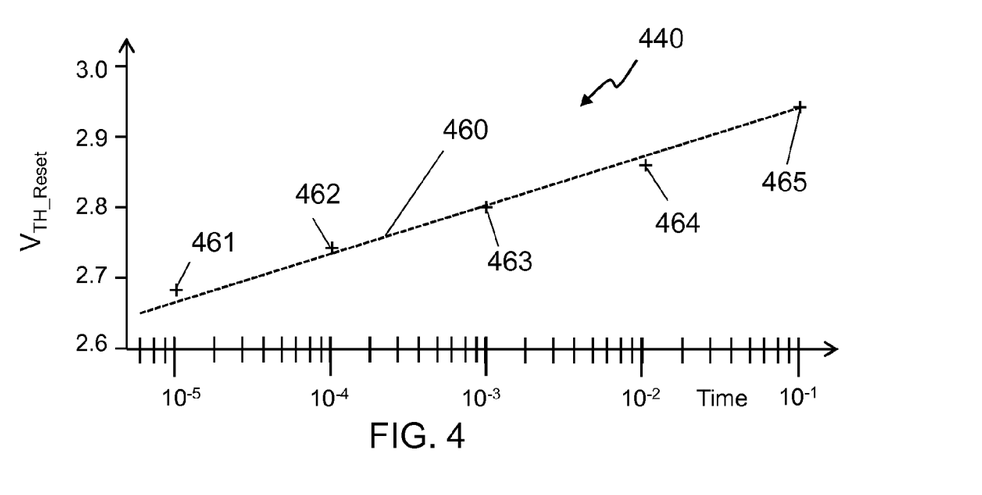
FIG. 4 is a graph showing a representation of a logarithmic relationship of threshold voltage to time for a PCMS cell.

FIG. 4 is a graph 440 showing a representation of a logarithmic relationship of $V_{TH\_Reset}$ to time for a PCMS cell 200. A comparable graph could be drawn for $V_{TH\_Set}$, and although the absolute voltage levels would be lower, the basic characteristics of such a graph may be similar. Due to structural relaxation in the ovonic or other phase change state material of PCMS systems, $V_{TH}$ for a PCMS cell 200 in either the set or reset state may increase over time. Such increasing is referred to herein as threshold voltage drift.

Graph 440 shows a conceptual representation of a threshold voltage drift $\Delta V_{drift}$ 460 of $V_{TH\_Reset}$ of a PCMS cell 200 based on several discrete data points 461-465 that may be determined through simulation, measurements of a single PCMS cell 200, measurements of multiple PCMS cells on a single integrated circuit die, or measurements of multiple PCMS cells on multiple integrated circuit dice. $\Delta V_{drift}$ 460 shows a change on a $V_{TH\_Reset}$ range over a time domain that is represented using a logarithmic time scale. The time domain that may be tested to accumulate the discrete data points 461-465 may be limited due to constraints on the amount of time allowable for testing but due to the physics of the phase change state material 206, for many embodiments the slope of $\Delta V_{drift}$ 460 may be relatively constant even for times before and after the time domain used to acquire the discrete data points 461-465.

In various embodiments, the change in $V_{TH}$ varies substantively linearly with a logarithm of time. Therefore, it may be possible to predict a $V_{TH}$ value for a PCMS cell 200 at a particular time after the PCMS cell 200 has been programmed by calculating a drift rate, $R_{drift}$, of $V_{TH}$. In some embodiments, $R_{drift}$ for a $V_{TH}$ drift, which may be the slope of $\Delta V_{drift}$ 460, may be determined by design testing of a PCMS device's performance. By way of illustration and not limitation, a threshold voltage $V_{TH}$ for a PCMS cell (or cells) may be evaluated repeatedly, such as at time $t_1$ after a particular state has been programmed in the PCMS cell 200, and again at a time $t_2$ after programming. The slope $R_{drift}$ may be calculated, for example, as:

$$R_{drift}=[V_{TH}(t_2)-V_{TH}(t_1)]/[\log(t_2)-\log(t_1)]=[V_{TH}(t_2)-V_{TH}(t_1)]/[\log(t_2/t_1)]$$

In some embodiments $V_{TH\_Set}$ may drift at a different rate than $V_{TH\_Reset}$ giving different values of $R_{drift}$ depending on the state of the PCMS cell 200, although various embodiments are not limited in this regard. It is understood that $\Delta V_{drift}$ 460 is merely illustrative, and that $\Delta V_{drift}$ 460 may variously exhibit any of a variety of changes in threshold voltage values which are substantively linear with the logarithm of any a variety of time values. Other embodiments may have a different electrical characteristic that drifts over time, such as the resistance of the memory cell. Other embodiments may exhibit drift characteristics that are not linear with the logarithm of time. As long as the drift is monotonic, repeatable and predictable for the time up to at least $t_{fin}$, the exact characteristics of the drift may not be important and the material may be suitable for various embodiments.

Once $R_{drift}$ has been determined, $R_{drift}$ may be used to predict $V_{TH}$ at a future point in time. For example if $\Delta V_{drift}$ 460 shows that $V_{TH\_Reset}$ passes through about 2.8V at a time 1 ms after the PCMS cell 200 is programmed to a reset state, and $R_{drift}$ has a value of about 0.07V per decade of time in seconds, it may be predicted that the value for $V_{TH\_Reset}$ may be about 3.1V at 1 second (s) after programming and about 3.6V at one year after programming:

$$V_{TH\_Reset}@1\text{ yr}=3.1V+0.7V*\log(3.15\times10^7)=3.6V$$

Figure 5:
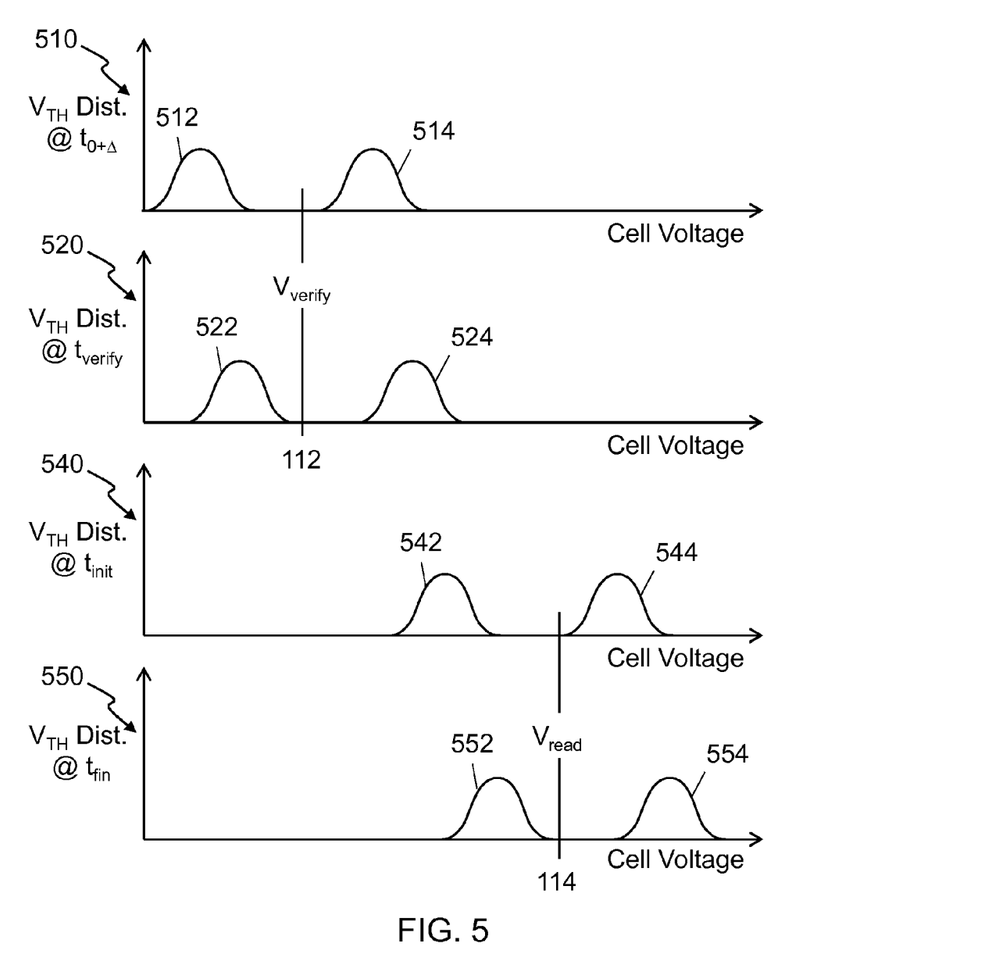
FIG. 5 is a group of graphs showing distributions of PCMS cell threshold voltage at several discrete points in time.

FIG. 5 is a group of graphs 510, 520, 540, 550 showing distributions of PCMS cell threshold voltages at several discrete points in time. As described for graph 360, the distributions may represent a large number of PCMS cells on a single integrated circuit die or distributed over a multitude of integrated circuit dice and may also represent variation over various operating voltages, operating temperatures, process variations or other parameters that may affect $V_{TM}$. Graph 510 shows $D_{Set}(t_0)$ 512 and $D_{Reset}(t_0)$ 514 at time $t_{0+\Delta}$ which occurs a very short period of time after $t_0$ such as 100 ps after time $t_0$. Graph 520 shows $D_{Set}(t_{verify})$ 522 and $D_{Reset}(t_{verify})$ 524 at time $t_{verify}$. Graph 540 shows $D_{Set}(t_{init})$ 542 and $D_{Reset}(t_{init})$ 544 at time $t_{init}$. Graph 550 shows $D_{Set}(t_{fin})$ 552 and $D_{Reset}(t_{fin})$ 554 at time $t_{fin}$. The different points in time have the following relative relationship:

$$t_0<t_{verify}\leq t_{init}<t_{fin}$$

Looking at the various graphs the effects of $V_{TH}$ drift can be seen with $D_{Set}(t_0)$ 512 occurring before $D_{Set}(t_{verify})$ 522, which occurs before $D_{Set}(t_{init})$ 542, and so on. Likewise, $D_{Reset}(t_0)$ 514 occurs before $D_{Reset}(t_{verify})$ 524 and so on. To determine a $V_{DM}$ that may be used as $V_{verify}$ 112, a value that is between a maximum value of $D_{Set}(t_{verify})$ 522 and the minimum value of $D_{Reset}(t_0)$ 514 may be chosen such as $V_{verify}$ 112. A $V_{DM}$ that may be used for $V_{read}$ 114 may be chosen between the maximum value of $D_{Set}(t_{fin})$ 552 and the minimum value of $D_{Reset}(t_{init})$ 544.

A collection of factors, including the targeted operating voltage of a device, $D_{Set}(t_0)$ 512 and $D_{Reset}(t_0)$ 514 for a particular phase change state material 206, the desired $t_{verify}$ time, and the drift rate of $V_{TH}$, may be used to help determine $t_{fin}$ and $t_{init}$. A value for $t_{fin}$ may be calculated so that the maximum of $D_{Reset}(t_{fin})$ 554 may be just under the targeted operating voltage of the device to ensure that any PCMS cell 200 may be programmed without exceeding the operating voltage. If a device has a charge pump or other mechanism for providing a voltage greater than the operating voltage, a longer $t_{fin}$ may be possible. Once $t_{fin}$ has been determined, a value for $t_{init}$ may be calculated so that the minimum of $D_{Reset}(t_{init})$ 544 is no less than the maximum of $D_{set}(t_{fin})$ 552 with some margin, allowing a valid value to be chosen for $V_{read}$ 114 that will turn on any cell that is in the set state and not turn on any cell that is in the reset state at any point in time between $t_{init}$ and $t_{fin}$. A value for $t_{verify}$ may be chosen based on a targeted device performance so that programming operations may be verified quickly and without being dependent on the value chosen for $t_{fin}$ or $t_{init}$.

Other embodiments may first choose a value for $t_{init}$ based on performance requirements and then chose $t_{fin}$ to be the longest possible time that still has a maximum value of $D_{Set}$ ($t_{fin}$) 552 that is lower than the minimum value of $D_{Reset}(t_{init})$ 544. Some embodiments may also include additional margin around $V_{read}$ for selecting $t_{fin}$ and $t_{init}$ to allow for slight variations in $V_{read}$.

Figure 6:
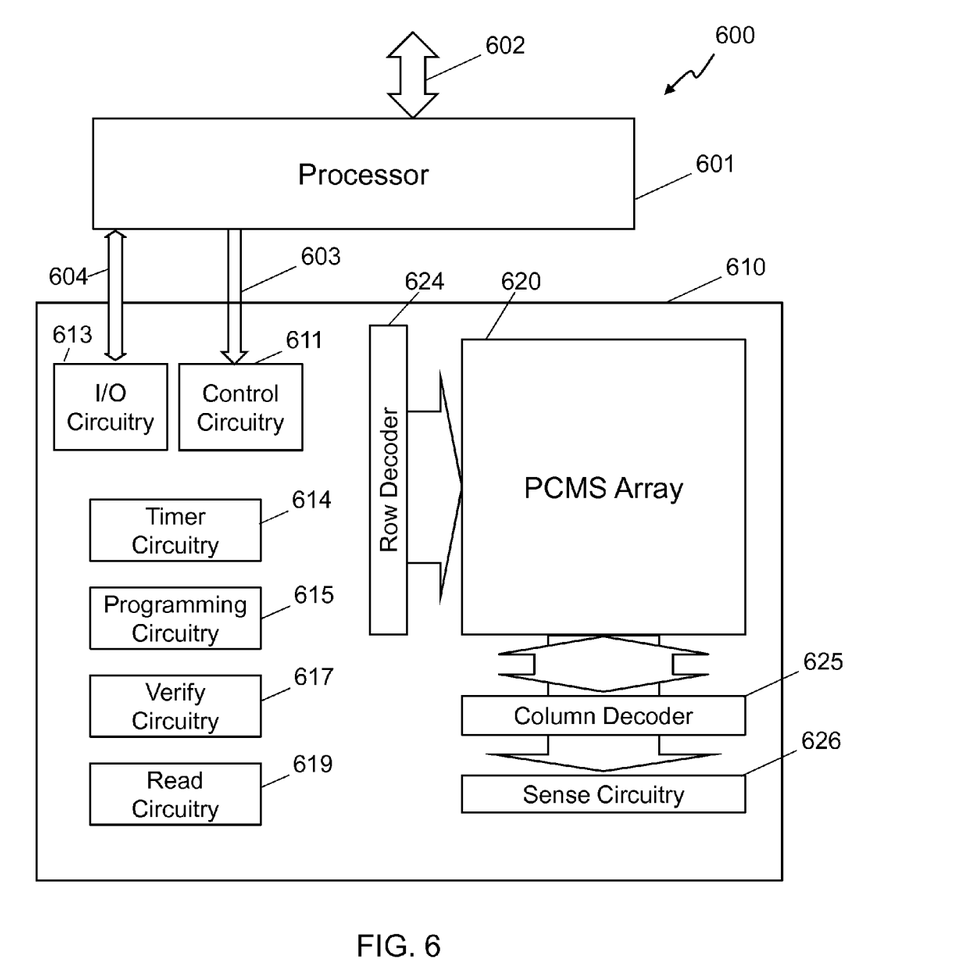
FIG. 6 is a block diagram of a system utilizing an embodiment of a fast verify for phase change memory.

FIG. 6 is a block diagram of a computing or storage system 600 utilizing an embodiment of a fast verify for phase change memory with switch including a processor 601 coupled to a memory device 610 with control/address lines 603 and data lines 604. In some embodiments, data and control may utilize the same lines. The processor 601 may be an external microprocessor, microcontroller, or some other type of external controlling circuitry. In some embodiments, the processor 601 may be integrated in the same package or even on the same die as the memory device 610. In some embodiments, the processor 601 may be integrated with the control circuitry 611, allowing some of the same circuitry to be used for both functions. The processor 601 may have external memory, such as random access memory (RAM) and read only memory (ROM), used for program storage and intermediate data, or it may have internal RAM or ROM. In some embodiments, the processor may use the memory device 610 for program or data storage. A program running on the processor 601 may implement many different functions including, but not limited to, an operating system, a file system, bad cell or block mapping, memory refresh to ensure no PCMS cell ages past $t_{fin}$, delaying read operations until $t_{init}$ time has elapses for a particular PCMS cell, and error management. The block diagram of computing or storage system 600 has been simplified to focus on features of the memory that are helpful in understanding this disclosure.

In some embodiments an external connection 602 is provided. The external connection 602 is coupled to the processor 601 and allows the processor 601 to communicate to external devices. In the case of a storage system, the external connection 602 may be used to provide an external device with non-volatile storage. The external connection 602 may be used to connect to a computer or other intelligent device such as a cell phone or digital camera using a standard or proprietary communication protocol. Examples of computer communication protocols that the external connection may be compatible with include, but are not limited to, any version of the following protocols: Universal Serial Bus (USB), Serial Advanced Technology Attachment (SATA), Small Computer System Interconnect (SCSI), Fibre Channel, Parallel Advanced Technology Attachment (PATA), Integrated Drive Electronics (IDE), Ethernet, IEEE-1394, Secure Digital Card interface (SD Card), Compact Flash interface, Memory Stick interface, Peripheral Component Interconnect (PCI) or PCI Express.

The memory device 610 may include an array 620 of phase change memory with switch (PCMS) cells as discussed herein. Respective PCMS cells 200 in the PCMS array 620 include a portion of phase change state material 206 and may optionally include a heater element such as bottom electrode 208 and middle electrode 204, and/or an access/isolation device such as an ovonic threshold switch (OTS) device 202. The PCMS array 620 may be arranged in banks of word line rows and bit line columns with respective rows using a row line 220 and respective columns using a column line 210.

Address signals and control signals 603 may be received and decoded by control circuitry 611 which may control row decoders 624 to control the row lines to the PCMS array 620 and column decoders 625 to control the column lines. I/O circuitry 613 may couple to the data lines 604 allowing data to be received from and sent to the processor 601. Sense circuitry 626 may be coupled to the PCMS array 620 and determine a logical state of selected PCMS cells. Timer 614 may measure periods of time to allow intervals such as $t_{verify}$ and $t_{init}$ to be determined and communicated to the various other circuits within the memory device 610. The timer 614 may be inside the memory device 610, inside the processor 601, or implemented as a separate function outside of the memory device 610 or processor 601. The timer 614 may use a counter of a free-running or gated clock signal in some embodiments. Other embodiments of the timer 614 may utilize a capacitor charging through a resistor or other analog techniques for measuring time. Some embodiments of the timer 614 may utilize firmware running on a controller within the memory device 610 or a separate microcontroller and yet other embodiments may use software running on the processor 601 to implement the timer 614. Systems 600 may use any of the approaches or mechanisms described above or other approaches or mechanisms for measuring the various time intervals described herein.

Programming circuitry 615 may generate electrical signals suitable to change the phase of the phase change material 206 in a PCMS cell 200 and may communicate those electrical signals to the various other circuits in the memory device 610 to program a particular PCMS cell or group of PCMS cells as described herein. Verify circuitry may perform a verify operation of any PCMS cell within a $t_{verify}$ time interval after the PCMS cell has been programmed by communicating to the various other blocks of the memory device 610 as described herein. Read circuitry 619 may perform a read operation in response to a read request from the processor 601 or other device by communicating to the various other blocks of the memory device 610 as described herein.

Various parameters, such as $t_{verify}$, $t_{init}$, $t_{fin}$, $V_{verify}$, and $V_{read}$ may not be determined at the time of design of the device and may be entered into the memory device 610 or system 600 after the integrated circuit die has been fabricated. In some embodiments, some or all of the parameters identified may be programmed into the die of the memory device 610 using programmable fuses or links. Other embodiments may utilize other methods for establishing parameters in the memory device 610 or system 600 such as input pin strapping or constants in software or other techniques.

Some embodiments of the memory device 610 may include a tracking list to track a group of PCMS cells that have been programmed within a certain amount of time in the past, such as within $t_{init}$ time. The tracking list may be used to determine if a particular PCMS cell may be read at the time that a read request is received. If the PCMS cell has been programmed within the past $t_{init}$ period of time, the memory device 610 may wait until $t_{init}$ time has elapsed before performing the read operation in some embodiments. In other embodiments, the memory device may use a different $V_{DM}$ to read a PCMS cell if the PCMS cell is included in the tracking list. A tracking list may be implemented as content addressable memory or other block that allows a certain number of PCMS cell addresses to be stored along with information about when the PCMS cell was last programmed.

The system illustrated in FIG. 6 has been simplified to facilitate a basic understanding of the features of the memory. Many different embodiments are possible including using a single processor 601 to control a plurality of memory devices 610 to provide for more storage space. Additional functions, such as a video graphics controller driving a monitor, and other devices for human oriented I/O may be included in some embodiments. Furthermore, processor 601 may be configured by a program of instructions, for example software, to implement claimed subject matter as discussed herein to control memory device 610 and its circuitry including PCMS array 620. In such embodiments, the software may be tangibly embodied in various aspects of the devices and/or systems described herein, in or on an article of manufacture having instructions stored thereon that, if executed by a machine such as processor 601, perform various aspects of a method to fast verify the phase change memory array 620 as described herein, although the scope of the claimed subject matter is not limited in this respect.

Figure 7A:
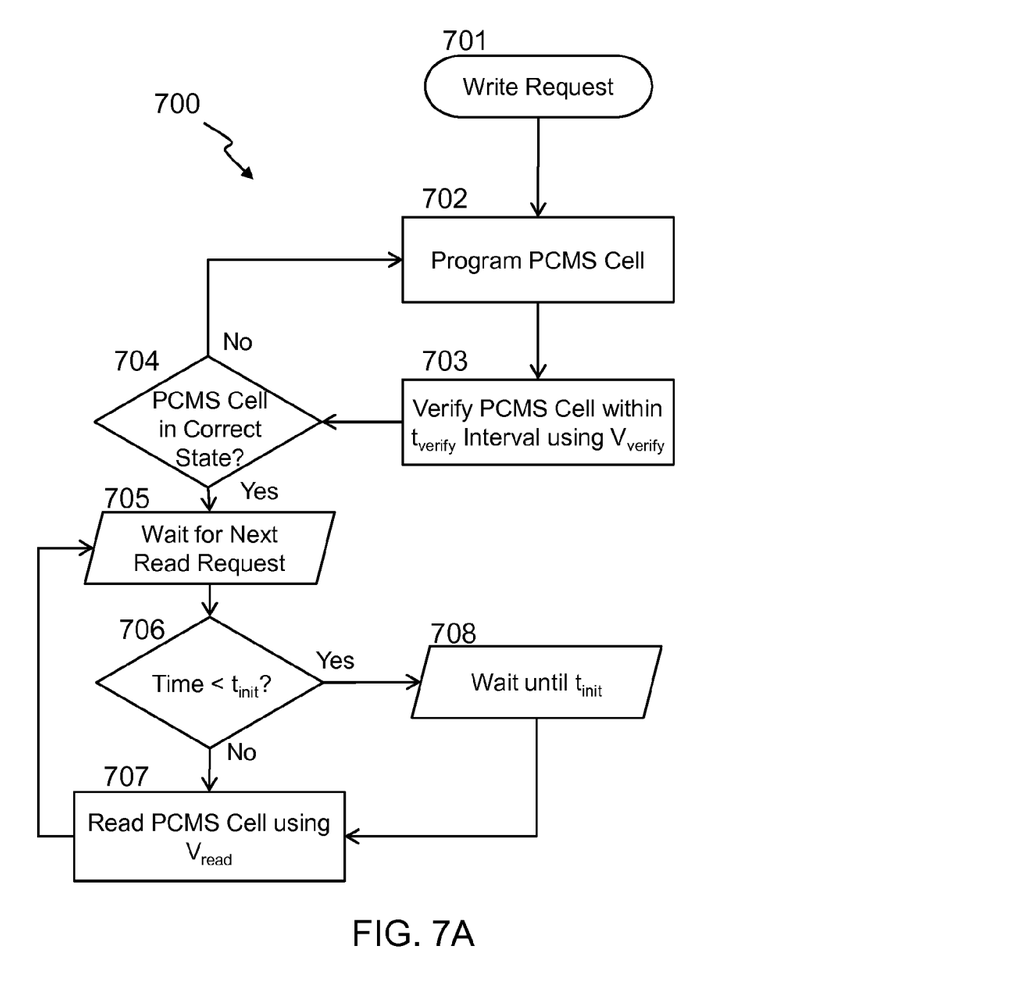
FIG. 7A is a flow chart of an embodiment of a fast verify for PCMS memory.

FIG. 7A is a flow chart 700 of an embodiment of a fast verify for phase change memory. The method starts at block 701 where a request to write an intended value, such as a "0" or "1" value, to a PCMS cell may be received. The PCMS cell may be programmed to an intended state at block 702. In one or more embodiments the intended state is a state of the PCMS cell that has been properly programmed to the intended value that was received as a part of a write to that PCMS cell. At a time after the PCMS cell is programmed that is within a $t_{verify}$ interval, the PCMS cell may be verified using $V_{verify}$ as the $V_{DM}$ at block 703. The results of the verify may be checked to see if the PCMS cell is in the intended state at block 704. In some embodiments, if the data read by the verify operation does not match the data that was programmed into the PCMS cell, the PCMS cell may be re-programmed at block 702 and re-verified at block 703. Other embodiments may simply flag an error if the PCMS cell does not properly verify allowing other high level processes to manage the error. If the verify determines that the PCMS cell has been properly programmed at block 704, the method waits for the next read request of that PCMS cell at block 705. If a read request for that PCMS cell is received, the time that has elapsed since the PCMS cell was programmed is evaluated at block 706 to see if at least $t_{init}$ time has elapsed since the PCMS cell was programmed. If the time of the read request is after $t_{init}$, the PCMS cell is read at block 707 using $V_{read}$ as the $V_{DM}$ and the method waits for the next read of that PCMS cell at block 705 again. If the time of the read request is found to be before $t_{init}$ at block 704, the method may wait until at least $t_{init}$ time has elapsed in block 708 before reading the PCMS cell using $V_{read}$ as $V_{DM}$ in block 707. The method may then wait for another read request at block 705.

Figure 7B:
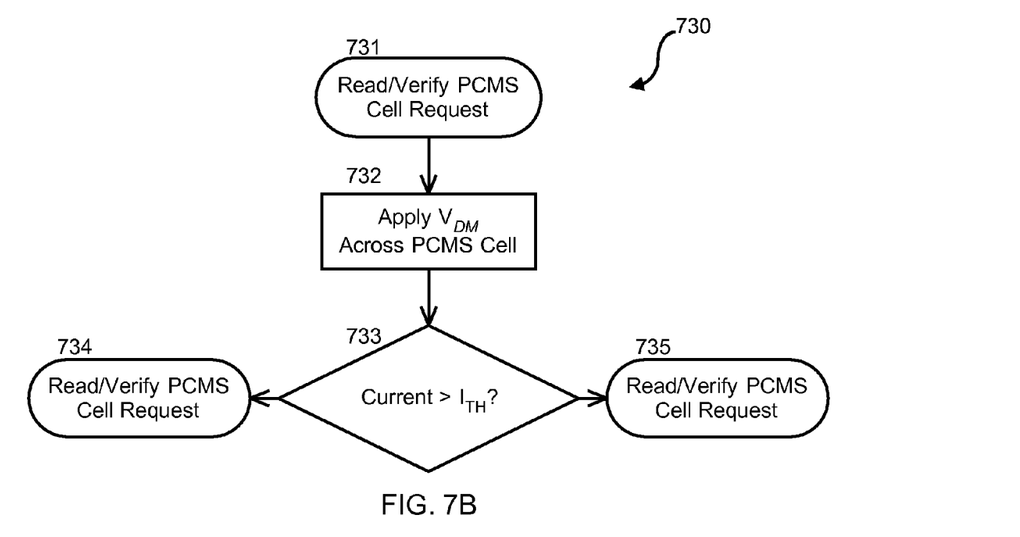
FIG. 7B is a flow chart describing an embodiment of a verify or read operation for use in various embodiments of a fast verify for PCMS memory.

FIG. 7B is a flow chart 730 describing an embodiment of a verify or read operation for use in various embodiments of a fast verify for phase change memory with switch such as the method described in flow chart 700. The method described by flow chart 730 may be used to provide more detail as to the operation that occurs in blocks 703 and 707 of flow chart 700. A read or verify of a PCMS cell is requested at block 731 with a particular voltage level that may be used for that verify or read operation. The particular voltage level specified is applied across the PCMS cell as the $V_{DM}$ in block 732. Depending on the state of the PCMS cell, the $V_{DM}$ applied may turn the PCMS cell on, allowing current to flow through the PCMS cell, or off, where very little if any current flows through the PCMS cell. The current flowing through the PCMS cell is evaluated against a threshold current, $I_{TH}$, at block 733. If the current flowing through the PCMS cell is greater than $I_{TH}$, the PCMS cell is determined to be set at block 735. If the current flowing through the PCMS cell is less than $I_{TH}$, the PCMS cell is determined to be reset at block 734.

It is appreciated that the claimed subject matter has been explained with reference to exemplary embodiments, and that the claimed subject matter is not limited to the specific details given above. References in the specification made to other embodiments fall into the scope of the present claimed subject matter.

Any reference to device may include a component, circuit, module, or any such mechanism in which the device can achieve the purpose or description as indicated by the modifier preceding the device. However, the component, circuit, module, or any such mechanism is not necessarily a specific limitation to the device.

Reference in the specification to "an embodiment," "one embodiment," "some embodiments," or "other embodiments" means that a particular feature, structure, or characteristic described in connection with the embodiments is included in at least some embodiments, but not necessarily all embodiments, of the claimed subject matter. The various appearances of "an embodiment," "one embodiment," or "some embodiments" are not necessarily all referring to the same embodiments.

If the specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element. As used herein, the term "coupled" includes direct and indirect connections. Moreover, where first and second devices are coupled, intervening devices including active devices may be located there between.

Those skilled in the art having the benefit of this disclosure will appreciate that many other variations from the foregoing description and drawings may be made within the scope of the present claimed subject matter. Indeed, the claimed subject matter is not limited to the details described above, and it will be apparent that various changes may be made in the form, construction and/or arrangement of the components thereof without departing from the scope and/or intent of the claimed subject matter or without sacrificing its material advantages, the form herein before described being merely an explanatory embodiment thereof, and/or further without providing substantial change thereto. It is the intention of the claims to encompass and/or include such changes.

What is claimed is:

1. A method comprising:
   verifying that a state of at least one storage element is in an intended state, within a verify time interval after programming the at least one storage element to the intended state, by applying a first voltage waveform that does not exceed a first demarcation voltage across the at least one storage element; and
   reading the state of the at least one storage element, after a predetermined time interval following the programming of the at least one storage element, by applying a second voltage waveform that does not exceed a second demarcation voltage across the at least one storage element, wherein the second demarcation voltage is greater than the first demarcation voltage and the predetermined time interval is at least as long as the verify time interval;
   wherein the at least one storage element has an electrical characteristic that changes over time.

2. The method of claim 1, wherein the at least one storage element is a phase change memory with switch (PCMS) storage element having a threshold voltage that is the electrical characteristic that changes over time; and
   wherein the threshold voltage is returned to a nominal threshold voltage from a drifted threshold voltage by programming the PCMS storage element, wherein the drifted threshold voltage is higher than the nominal threshold voltage due to a drift of the threshold voltage of the PCMS storage element over time.

3. The method of claim 1, wherein the verify time interval is no greater than about 1 microsecond (μs).

4. The method of claim 1, wherein the verify time interval is no greater than about 100 nanoseconds (ns) and the predetermined time interval is between about 1 millisecond (ms) and about 10 ms.

5. The method of claim 1 further comprising:
waiting until the predetermined time interval has elapsed before reading the state of the at least one storage element by applying the second voltage waveform across the at least one storage element if a read request is received during the predetermined time interval following the programming of the at least one storage element.

6. The method of claim 1, further comprising:
re-programming the at least one storage element to the intended state if the state of the at least one storage element is not verified to be the intended state; and
re-verifying that the state of the at least one storage element is the intended state within the verify time interval after the re-programming of the at least one storage element by applying the first voltage waveform that does not exceed the first demarcation voltage across the at least one storage element.

7. A device comprising:
an array of storage elements, wherein at least one storage element is included in the array of storage elements;
verify circuitry verifying that the at least one storage element has been properly programmed within a verify time interval after programming the at least one storage element by applying a first voltage waveform that does not exceed a first demarcation voltage across the at least one storage element;
read circuitry reading the at least one storage element in response to a read request by applying a second voltage waveform that does not exceed a second demarcation voltage across the at least one storage element, the second demarcation voltage being greater than the first demarcation voltage;
wherein the at least one storage element has an electrical characteristic that changes over time.

8. The device of claim 7, wherein the at least one storage element comprises chalcogenide material.

9. The device of claim 7, wherein the at least one storage element is a phase change memory with switch (PCMS) storage element having a threshold voltage that is the electrical characteristic that changes over time; and
wherein the threshold voltage is returned to a nominal threshold voltage from a drifted threshold voltage by programming the PCMS storage element, wherein the drifted threshold voltage is higher than the nominal threshold voltage due to a drift of the threshold voltage of the PCMS storage element over time.

10. The device of claim 7, wherein the verify time interval is no greater than about 1 microsecond (μs).

11. The device of claim 7, further comprising:
a timer measuring a predetermined time interval after the programming of the at least one storage element, wherein the predetermined time interval is at least as long as the verify time interval;
wherein the read circuitry waits until the predetermined time interval has elapsed before reading the state of the at least one storage element if the read request is received during the predetermined time interval.

12. The device of claim 11, wherein the verify time interval is no greater than about 100 nanoseconds (ns) and the predetermined time interval is between about 1 millisecond (ms) and about 10 ms.

13. The device of claim 11, wherein the predetermined time interval is established in the device after wafer fabrication.

14. A system comprising:
a processor; and
memory circuitry coupled to the processor;
wherein the processor is capable of reading and writing data to the memory circuitry; and
wherein the memory circuitry comprises:
at least one storage element;
verify circuitry verifying that the at least one storage element has been properly programmed within a verify time interval after programming the at least one storage element by applying a first voltage waveform that does not exceed a first demarcation voltage across the at least one storage element;
read circuitry reading the at least one storage element in response to a read request from the processor by applying a second voltage waveform that does not exceed a second demarcation voltage across the at least one storage element, the second demarcation voltage being greater than the first demarcation voltage;
wherein the at least one storage element has an electrical characteristic that changes over time.

15. The system of claim 14, wherein the at least one storage element is a phase change memory with switch (PCMS) storage element having a threshold voltage that is the electrical characteristic that changes over time; and
wherein the threshold voltage is returned to a nominal threshold voltage from a drifted threshold voltage by programming the PCMS storage element, wherein the drifted threshold voltage is higher than the nominal threshold voltage due to a drift of the threshold voltage of the PCMS storage element over time.

16. The system of claim 14, further comprising:
a timer measuring a predetermined time interval after the programming of the at least one storage element, wherein the predetermined time interval is at least as long as the verify time interval;
wherein the read circuitry waits until the predetermined time interval has elapsed before reading the state of the at least one storage element if the read request is received during the predetermined time interval.

17. The system of claim 16, wherein the verify time interval is no greater than about 100 nanoseconds (ns) and the predetermined time interval is between about 1 millisecond (ms) and about 10 ms.

18. The system of claim 14, wherein the at least one storage element comprises chalcogenide material.

19. The system of claim 14, wherein the verify time interval is no greater than about 1 microsecond (μs).

20. The system of claim 14, wherein the predetermined time interval is established in the device after wafer fabrication.

* * * * *